(12) United States Patent
Song (10) Patent No.: US 9,257,376 B2
(45) Date of Patent: Feb. 9, 2016

(54) SEMICONDUCTOR PACKAGE AND METHOD OF MANUFACTURING THE SAME

(71) Applicant: SAMSUNG ELECTRO-MECHANICS CO., LTD., Suwon-Si (KR)

(72) Inventor: Sung Min Song, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/533,064

(22) Filed: Nov. 4, 2014

(65) Prior Publication Data

US 2015/0179556 A1    Jun. 25, 2015

(30) Foreign Application Priority Data

Dec. 20, 2013   (KR) .......................... 10-2013-0160567

(51) Int. Cl.
| | | |
|---|---|---|
| *H05K 1/02* | (2006.01) | |
| *H01L 23/495* | (2006.01) | |
| *H01L 21/48* | (2006.01) | |
| *H01L 21/56* | (2006.01) | |
| *H01L 23/31* | (2006.01) | |
| *H01L 23/433* | (2006.01) | |

(52) U.S. Cl.
CPC ...... *H01L 23/49568* (2013.01); *H01L 21/4825* (2013.01); *H01L 21/4842* (2013.01); *H01L 21/4882* (2013.01); *H01L 21/565* (2013.01); *H01L 23/31* (2013.01); *H01L 23/4334* (2013.01); *H01L 23/4952* (2013.01); *H01L 23/49551* (2013.01); *H01L 23/49575* (2013.01); *H01L 23/49531* (2013.01); *H01L 2224/48091* (2013.01); *H01L 2224/48137* (2013.01); *H01L 2224/48247* (2013.01); *H01L 2924/13055* (2013.01)

(58) Field of Classification Search
CPC ............... H01L 23/4334; H01L 23/31; H01L 23/49568; H01L 23/49575; H01L 21/4842; H01L 23/4952; H01L 21/4825; H01L 21/565; H01L 21/4882; H01L 23/49551; H01L 2224/48091; H01L 23/49531; H01L 2224/48137

See application file for complete search history.

(56) References Cited

U.S. PATENT DOCUMENTS

| | | | | |
|---|---|---|---|---|
| 5,371,043 A | * | 12/1994 | Anderson | ........... H01L 23/3731 164/108 |
| 2003/0173579 A1 | * | 9/2003 | Ishii | ...................... H01L 25/072 257/177 |
| 2014/0347836 A1 | * | 11/2014 | Nakamura | .......... H01L 23/3121 361/764 |

FOREIGN PATENT DOCUMENTS

KR   2003-0080900   10/2003

\* cited by examiner

*Primary Examiner* — Roy Potter
(74) *Attorney, Agent, or Firm* — Ladas & Parry, LLP (57) ABSTRACT

There are provided a semiconductor package and a method of manufacturing the same. The semiconductor package according to an exemplary embodiment of the present disclosure includes: a substrate having a first device mounted thereon; a first lead frame formed on the substrate; a second lead frame formed to be spaced apart from the substrate; a post formed on the substrate and formed between the first lead frame and the second lead frame; and a molding part formed to surround the substrate and formed to protrude portions of the first and second lead frames, wherein the post includes a body part bonded to the substrate and a protruding part protruded to an exterior of the molding part.

20 Claims, 5 Drawing Sheets

SEMICONDUCTOR PACKAGE AND METHOD OF MANUFACTURING THE SAME

CROSS-REFERENCE TO RELATED APPLICATION

This application claims the foreign priority benefit of Korean Patent Application No. 10-2013-0160567, filed on Dec. 20, 2013, entitled "Semi-Conductor Package and the Method of Manufacturing for the Same" which is hereby incorporated by reference in its entirety into this application.

BACKGROUND

The present disclosure relates to a semiconductor package and a method of manufacturing the same.

In accordance with an energy efficiency regulation, an interest in power conversion and energy efficiency has been increased. A power semiconductor module has been needed to have properties such as miniaturization, high heat dissipation, high reliability, and the like, in accordance with a demand of a market as well as maximization of power conversion efficiency. As an application of the power semiconductor module is recently diversified, there are various demands for ratings and forms of the power semiconductor module. For example, since a product of 1200V-100 A or less needs to have high insulating characteristic and heat dissipating characteristic rather than low power characteristic, but has a device mounted thereon, having a size significantly smaller than that of large power product, it does not need to adopt a housing structure of high cost in the case in which only a heat dissipating substrate is well selected. Therefore, in order to satisfy the above-mentioned various demands, a development of a power semiconductor module having a new structure obtained by taking account of an electrical connection, a heat dissipating design, a structural design, and the like of the power semiconductor module while securing a power semiconductor device having stabilized characteristics is demanded.

RELATED ART DOCUMENT

Patent Document (Patent Document 1) Korean Patent Laid-Open Publication No. 2003-0080900

SUMMARY

An aspect of the present disclosure may provide a semiconductor package capable of serving as a support pin by forming a post having excellent thermal conduction on an upper surface of a semiconductor package substrate, and a method of manufacturing the same.

An aspect of the present disclosure may also provide a semiconductor package capable of disconnecting a package from the outside to improve moisture-resistant property and fire-resistant property by forming a post having excellent thermal conduction on an upper surface of a semiconductor package substrate, and a method of manufacturing the same.

According to an aspect of the present disclosure, a semiconductor package may include: a substrate having a first device mounted thereon; a first lead frame formed on the substrate; a second lead frame formed to be spaced apart from the substrate; a post formed on the substrate and formed between the first lead frame and the second lead frame; and a molding part formed to surround the substrate and formed to protrude portions of the first and second lead frames, wherein the post includes a body part bonded to the substrate and a protruding part protruded to an exterior of the molding part.

The body part may have a diameter larger than that of the protruding part.

The semiconductor package may further include a spring formed in the body part.

A top surface portion of the spring and a bottom surface portion of the protruding part may be formed to be in contact with each other.

The protruding part may protrude to an exterior of the body part by elastic force.

The protruding part may be inserted into the body part by external pressure.

The semiconductor package may further include a main board penetrating through the first and second lead frames and formed to be spaced apart from an upper portion of the molding part.

A bottom surface portion of the main board and a top surface portion of the protruding part may be formed to be in contact with each other.

The semiconductor package may further include a second device mounted on the second lead frame.

The semiconductor package may further include a wire electrically connecting at least two of the substrate, the first device, the second device, the first lead frame, and the second lead frame to each other.

According to another aspect of the present disclosure, a method of manufacturing a semiconductor package may include: preparing a substrate on which a first lead frame, a second lead frame, and a first device are mounted; forming a post on the substrate and between the first lead frame and the second lead frame; forming a molding part to surround the substrate and protrude portions of the first and second lead frames; and bending the first and second lead frames by performing a trimming process and a forming process for the first and second lead frames, wherein the post includes a body part bonded to the substrate and a protruding part protruded to an exterior of the molding part.

The method may further include, after the preparing of the substrate, mounting a second device on the second lead frame.

The method may further include, after the mounting of the second device, forming a wire electrically connecting at least two of the substrate, the first and second lead frames, and the first and second devices to each other.

The body part may have a diameter larger than that of the protruding part.

The semiconductor package may further include a spring formed in the body part.

The protruding part may protrude to an exterior of the body part by elastic force.

The protruding part may be inserted into the body part by external pressure.

The forming of the molding part may include: seating the substrate in a lower mold; inserting the protruding part into the body part by positioning an upper mold on the lower mold; injecting a molding material; and removing the mold.

The method may further include, after the bending of the lead frames, positioning a main board to be electrically connected to the first and second lead frames and to be spaced apart from an upper portion of the molding part.

A bottom surface portion of the main board and a top surface portion of the protruding part may be formed to be in contact with each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

Semiconductor Package

Figure 1:
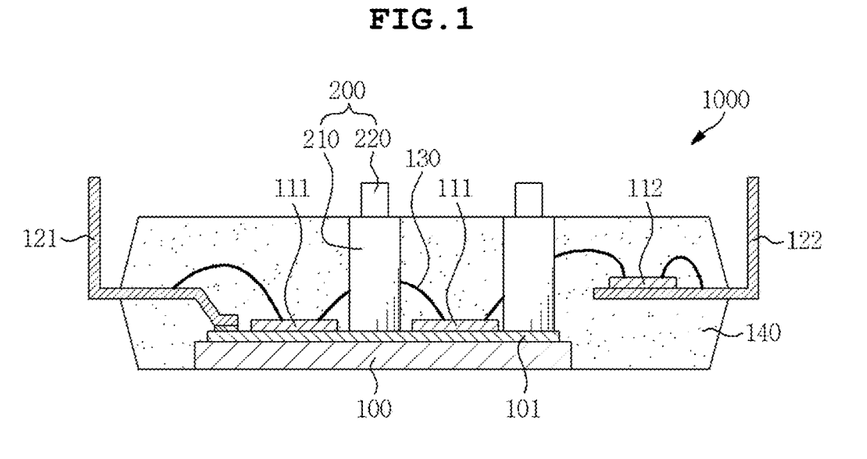
FIG. 1 is a cross-sectional view of a semiconductor package according to a first exemplary embodiment of the present disclosure.

FIG. 1 is a cross-sectional view of a semiconductor package according to a first exemplary embodiment of the present disclosure.

As shown in FIG. 1, a semiconductor package 1000 according to a first exemplary embodiment of the present disclosure includes a substrate 100 having a first device 111 mounted thereon, a first lead frame 121 formed on the substrate 100, a second lead frame 122 formed to be spaced apart from the substrate 100, a post 200 formed on the substrate 100 and formed between the first lead frame 121 and the second lead frame 122, and a molding part 140 formed to surround the substrate 100 and formed to protrude portions of the first and second lead frames 121 and 122, wherein the post 200 includes a body part 210 bonded to the substrate 100 and a protruding part 220 protruded to an exterior of the molding part 140.

Although not shown, the substrate 100 may include a metal plate, an insulating layer formed on one surface of the metal plate, and a connecting pad 101 formed on the insulating layer.

In this case, the metal plate may be made of aluminum Al or aluminum (Al) alloy having thermal conductivity as well as a metal material capable of being easily obtained at a relatively low cost, but is not particularly limited thereto. For example, any material may be used as long as it is a metal having thermal conductivity.

Although the present exemplary embodiment illustrates a case in which the substrate 100 includes the metal plate, the substrate 100 is not limited thereto. For example, the substrate 100 may include a metal substrate having an anodized layer, a printed circuit board, a ceramic substrate, and the like.

The first device 111 and the first lead frame 121 may be formed on the connecting pad 101 so as to be electrically connected to each other.

Although not shown, an adhesive may be interposed between the connecting pad 101 and the first device 111, and between the first device 111 and the first lead frame 121. The adhesive may be made of a solder or a conductive epoxy having a relatively high thermal conductivity to efficiently discharge heat, but is not particularly limited thereto.

In addition, the second lead frame 122 may be formed to be spaced apart from the substrate 110. Here, the second device 112 may be formed on the second lead frame 122.

In this case, a wire 130 may be formed so that at least two of the first device 111, the second device 112, the first lead frame 121, the second lead frame 122, and the substrate 100 are electrically connected to each other.

Here, the wire 130 may be made of aluminum (Al), gold (Au), copper (Cu), or the like, but is not particularly limited thereto. In general, the wire applying a rating voltage of high voltage to a semiconductor part, which is a power device, may be made of aluminum (Al).

In the present exemplary embodiment, power devices having a large heating value such as an insulated gate bipolar transistor (IGBT), a diode, and the like are formed on the substrate 100 as the first device 111 and a control device having a small heating value such as a control integrated circuit (IC) is formed on the second lead frame 122 as the second device 112, but the present disclosure is not particularly limited thereto.

In addition, the molding part 140 formed to cover the substrate 100, the first device 111, and the second device 112 and covering portions of the first lead frame 121 and the second lead frame 122 may be formed.

In this case, the molding part 140 may be made of silicone gel, an epoxy molded compound (EMC), or the like, but is not particularly limited thereto.

In addition, one or more posts 200 may be formed on the substrate 100. Although two posts 200 are formed according to the present exemplary embodiment, it is apparent that positions and the number of posts 200 may be changed by those skilled in the art as needed.

In this case, the post 200 may be formed to be spaced apart from the first device 111 and may be formed so as not to be in contact with the wire 130.

In addition, the post 200 may be made of a metal material having excellent thermal conductivity.

According to the present exemplary embodiment, the post 200 includes the body part 210 and the protruding part 220 having a cylindrical shape. In this case, the body part 210 may have a diameter larger than that of the protruding part 220.

Specifically, according to the present exemplary embodiment, the body part 210 has a bottom surface portion formed to be in contact with the substrate 100 and the entire body part 210 may be inserted into the molding part 140. In this case, the protruding part 220 may be formed to protrude from a top surface portion of the body part 210, that is, a top surface portion of the molding part 140.

This is to prevent a lift phenomenon of the substrate due to the post 200 at the time of molding to suppress a mold flash phenomenon. In addition, this serves to disconnect the upper surface of the substrate from the outside, such that moisture-resistant property and fire-resistant property may be improved.

Figure 2:
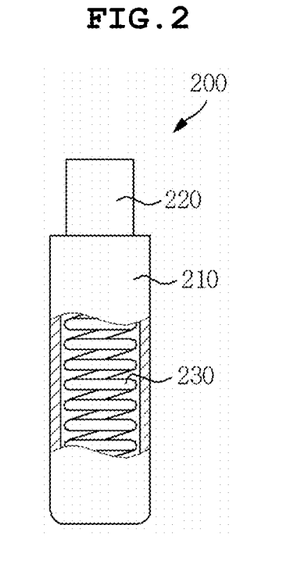
FIG. 2 is a cross-sectional view of a post according to a first exemplary embodiment of the present disclosure.

As shown in FIG. 2, the post 200 is shown in detail.

Here, a spring 230 may be included in the body part 210 of the post 220. The protruding part 220 may be formed at a position bonded to an upper portion of the spring 230.

When external pressure is applied onto the protruding part 220, the protruding part 220 may be inserted into the body part 210 by the spring 230. In this case, the upper surface of the protruding part 220 and the upper surface of the body part 210 may be co-linearly positioned.

In addition, the protruding part 220 may protrude from the body part 210 by elastic force (restoring force) of the spring 230.

Figure 3:
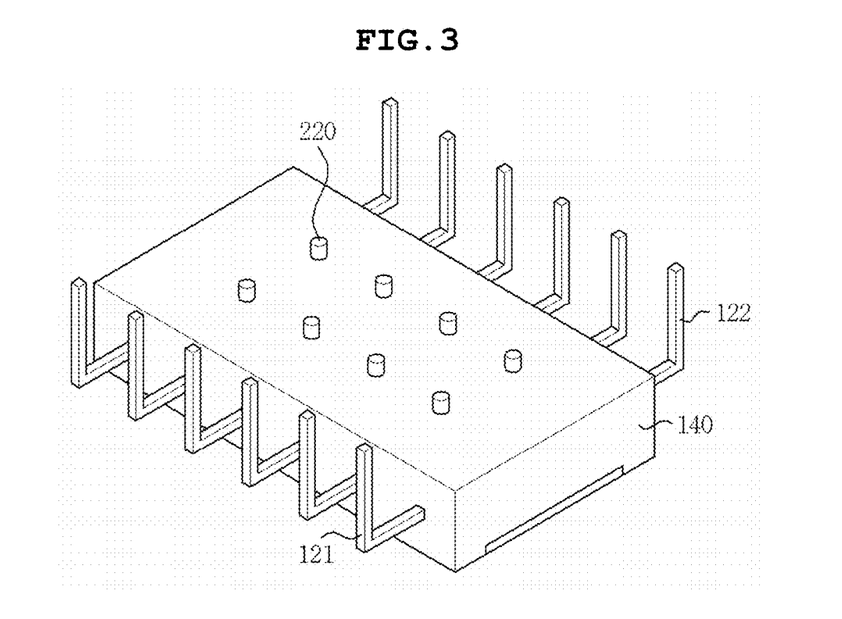
FIG. 3 is a plan view of a semiconductor package according to a first exemplary embodiment of the present disclosure.

FIG. 3 is a plan view of a semiconductor package according to a first exemplary embodiment of the present disclosure.

As shown in FIG. 3, according to the present exemplary embodiment of the present disclosure, a plurality of first lead frames 121 and second lead frames 122 may be formed and a plurality of posts 200 may be formed. In this case, the protruding part 220 may have a form protruded from an upper portion of the molding part 140.

Figure 4:
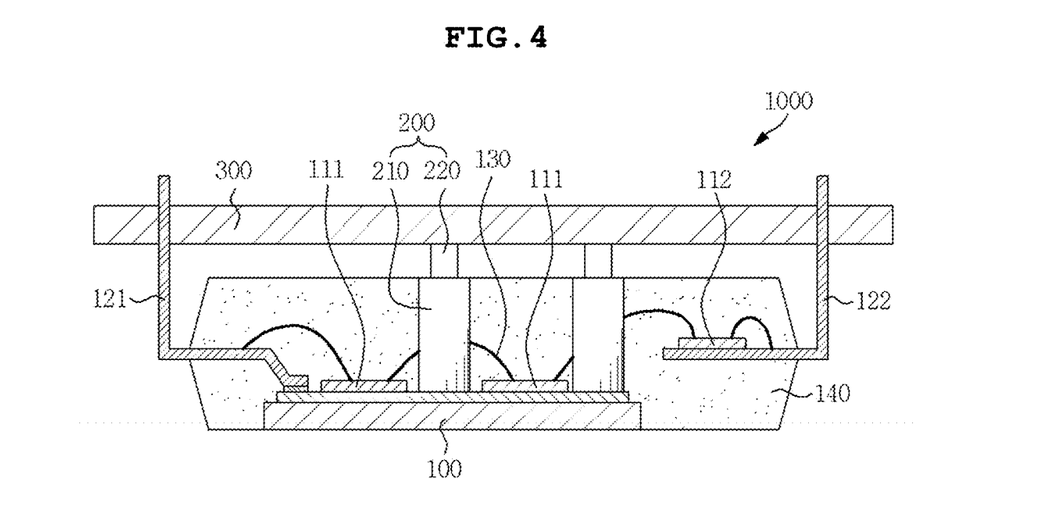
FIG. 4 is a cross-sectional view of a semiconductor package according to a second exemplary embodiment of the present disclosure.

FIG. 4 is a cross-sectional view of a semiconductor package according to a second exemplary embodiment of the present disclosure.

In the present embodiment, a description of configurations overlapped with the configurations described in the above-mentioned first exemplary embodiment will be omitted. In addition, the same reference numerals will be added to the same configurations as the configurations in the first exemplary embodiment.

As shown in FIG. 4, the main board 300 may be formed to be spaced apart from the substrate 100 so as to penetrate through the portions of the first lead frame 121 and the second lead frame 122. Here, a bottom surface portion of the main board 300 may be formed to be in contact with the top surface portion of the protruding part 220 of the post 200.

In this case, a surface of the main board 300 which is in contact with the protruding part 220 may be made of an insulating material in order to prevent problems such as a short circuit, and the like.

In addition, although not shown, since the main board 300 is fixed by a jig upon being mounted, pressure larger than elastic force of the spring 230 of the post 200 may not be applied. As a result, the protruding part 220 of the post 200 may serve as a stopper.

Method of Manufacturing Semiconductor Package

FIGS. 5 through 11 are process flow charts of a method of manufacturing a semiconductor package according to another exemplary embodiment of the present disclosure.

Figure 5:
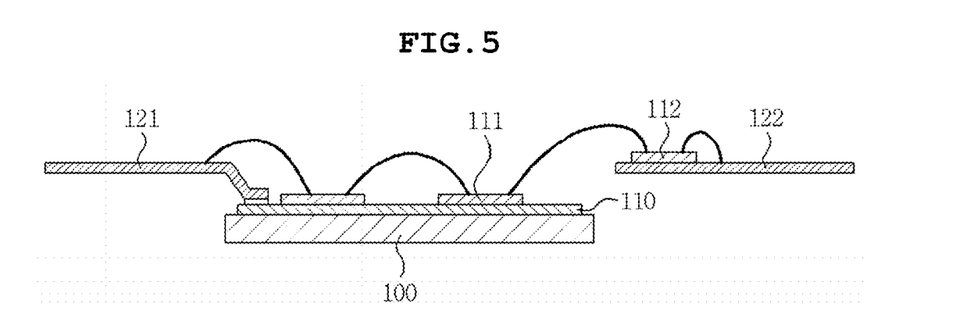
FIGS. 5 through 11 are process flow charts of a method of manufacturing a semiconductor package according to another exemplary embodiment of the present disclosure.

As shown in FIG. 5, a substrate 100 is first prepared.

Although not shown, the substrate 100 may include a metal plate, an insulating layer formed on one surface of the metal plate, and a connecting pad 101 formed on the insulating layer.

In this case, the metal plate may be made of aluminum Al or aluminum (Al) alloy having thermal conductivity as well as a metal material capable of being easily obtained at a relatively low cost, but is not particularly limited thereto. For example, any material may be used as long as it is a metal having thermal conductivity.

Although the present exemplary embodiment illustrates a case in which the substrate 100 includes the metal plate, the substrate 100 is not limited thereto. For example, the substrate 100 may include a metal substrate having an anodized layer, a printed circuit board, a ceramic substrate, and the like.

A first device 111 and a first lead frame 121 may be formed on the connecting pad 101 so as to be electrically connected to each other.

Although not shown, an adhesive may be interposed between the connecting pad 101 and the first device 111, and between the first device 111 and the first lead frame 121. The adhesive may be made of a solder or a conductive epoxy having a relatively high thermal conductivity to efficiently discharge heat, but is not particularly limited thereto.

In addition, a second lead frame 122 may be formed to be spaced apart from the substrate 110. Here, a second device 112 may be formed on the second lead frame 122.

In this case, a wire 130 may be formed so that at least two of the first device 111, the second device 112, the first lead frame 121, the second lead frame 122, and the substrate 100 are electrically connected to each other.

Here, the wire 130 may be made of aluminum (Al), gold (Au), copper (Cu), or the like, but is not particularly limited thereto. In general, the wire applying a rating voltage of high voltage to a semiconductor part, which is a power device, may be made of aluminum (Al).

In the present exemplary embodiment, power devices having a large heating value such as an insulated gate bipolar transistor (IGBT), a diode, and the like are formed on the substrate 100 as the first device 111 and a control device having a small heating value such as a control integrated circuit (IC) is formed on the second lead frame 122 as the second device 112, but the present disclosure is not particularly limited thereto.

Figure 6:
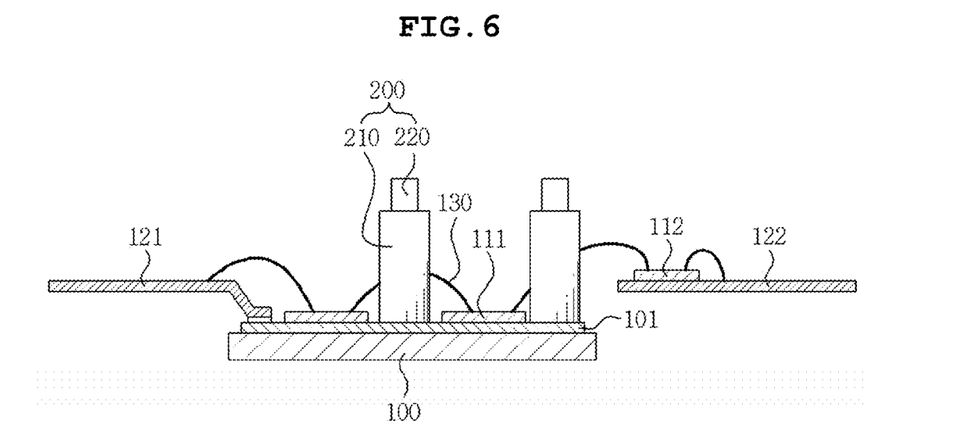

As shown in FIG. 6, one or more posts 200 may be formed on the substrate 100. Although two posts 200 are formed according to the present exemplary embodiment, it is apparent that positions and the number of posts 200 may be changed by those skilled in the art as needed.

In this case, the post 200 may be formed to be spaced apart from the first device 111 and may be formed so as not to be in contact with the wire 130.

Here, since the post 200 is made of a metal material, it may be formed on portions formed by forming an insulating material on the substrate 100.

According to the present exemplary embodiment, the post 200 includes a body part 210 and a protruding part 220 having a cylindrical shape. In this case, the body part 210 may have a diameter larger than that of the protruding part 220.

Specifically, a spring 230 may be included in the body part 210 of the post 220. The protruding part 220 may be formed at a position bonded to an upper portion of the spring 230.

Figure 7:
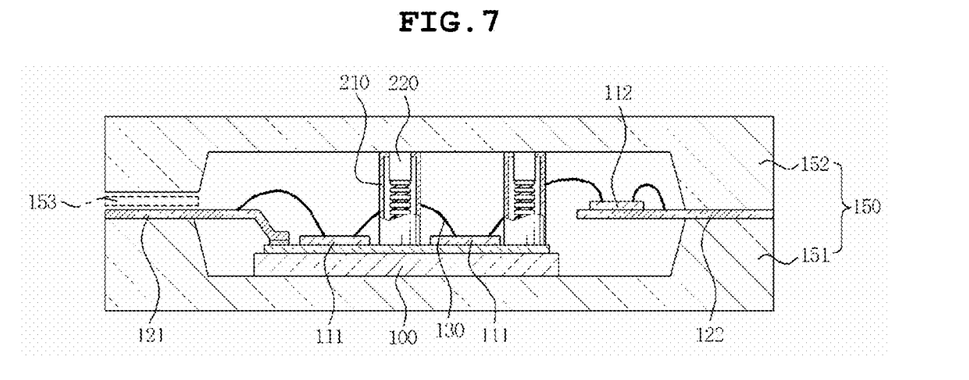

As shown in FIG. 7, the substrate 100 may be seated in a cavity of a lower mold 151. In addition, a cavity of an upper mold 152 may be positioned so as to face the cavity of the lower mold 151.

In this case, a top surface portion of the cavity of the upper mold 152 may apply pressure to the post 200. Thus, the protruding part 220 may be inserted into the body part 210 by the pressure. In this case, the upper surface of the protruding part 220 and the upper surface of the body part 210 may be co-linearly positioned.

In addition, a molding material may be injected through a molding material inlet 153.

Here, the molding material may be made of silicone gel, an epoxy molded compound (EMC), or the like, but is not particularly limited thereto.

Meanwhile, since the molding material is not formed on the upper surface of the protruding part 220 of the post 200, the protruding part may protrude to the outside by the spring.

Figure 8:
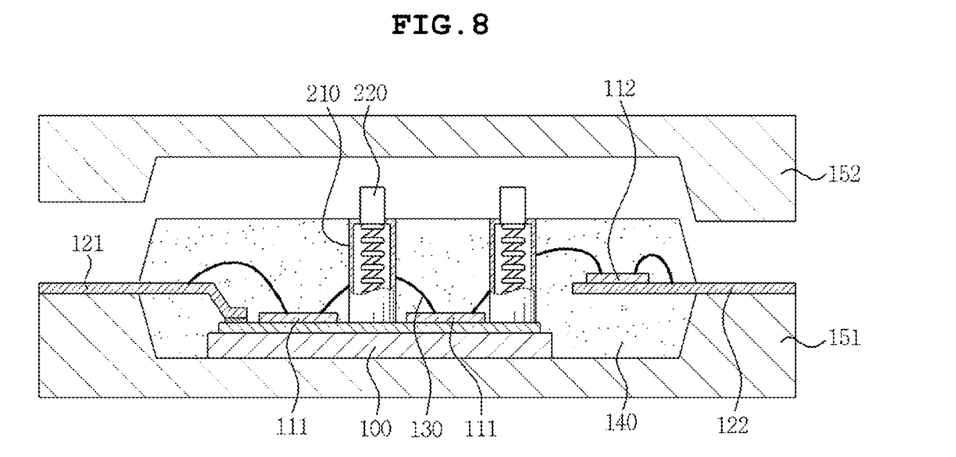

As shown in FIG. 8, the upper mold 152 may be removed.

In this case, the protruding part 220 of the post 200 may protrude to an exterior of the body part 210 by elastic force (restoring force).

Figure 9:
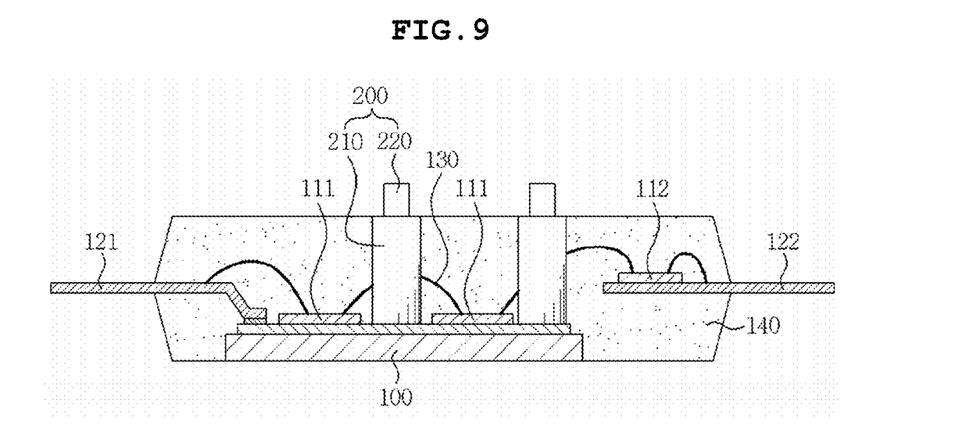

As shown in FIG. 9, a molding part 140 may be formed by removing the lower mold 151.

In this case, the protruding part 220 may protrude to an exterior of the molding part 140 and the top surface portion of the body part 210 and the top surface portion of the molding part 140 may be co-linearly positioned.

According to the present exemplary embodiment, the post 200 is formed on the substrate 100, such that a lift phenomenon of the substrate due to the post 200 at the time of molding is prevented, thereby suppressing a mold flash phenomenon. In addition, this serves to disconnect the upper surface of the substrate from the outside, such that moisture-resistant property and fire-resistant property may be improved.

Figure 10:
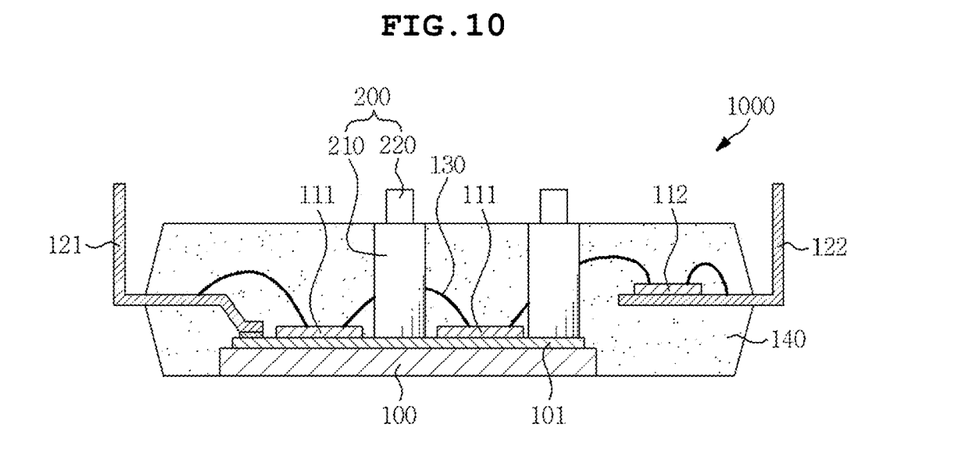

As shown in FIG. 10, a trimming process and a forming process are performed for the first lead frame 121 and the second lead frame 122, such that a step may be formed. In this case, both ends of the first and second lead frames 121 and 122 may be bent in a direction opposing the position of the substrate 100 due to the step.

Figure 11:
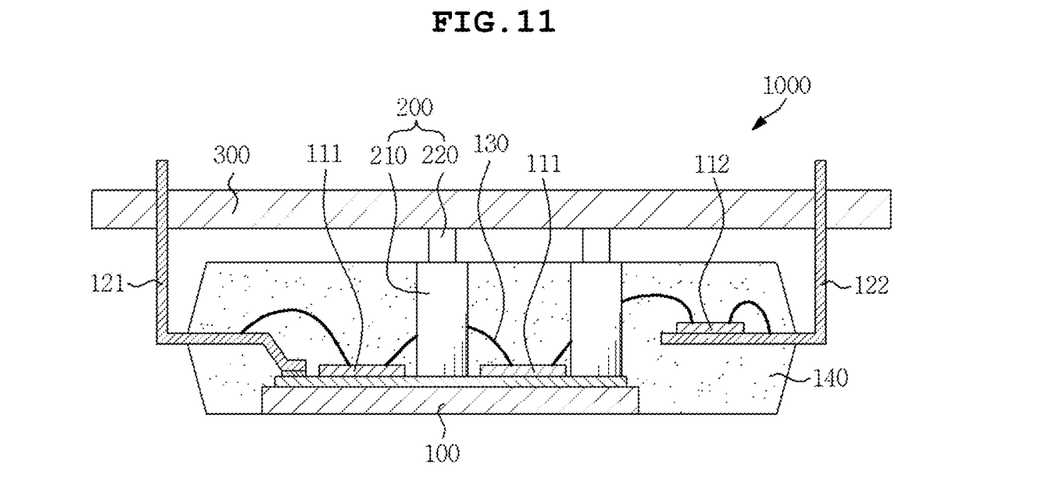

As shown in FIG. 11, the main board 300 may be positioned to penetrate through portions of the first lead frame 121 and the second lead frame 122.

Here, a bottom surface portion of the main board 300 may be formed to be in contact with the top surface portion of the protruding part 220 of the post 200.

In this case, a surface of the bottom surface portion of the main board 300 which is in contact with the protruding part 220 may be made of an insulating material in order to prevent problems such as a short circuit, and the like.

In addition, although not shown, since the main board 300 is fixed by a jig upon being mounted, pressure larger than elastic force of the spring 230 of the post 200 may not be applied. As a result, the protruding part 220 of the post 200 may serve as a stopper.

As set forth above, in the semiconductor package and the method of manufacturing the same according to the exemplary embodiments of the present disclosure, the semiconductor package may serve as the support pin at the time of molding by forming the post on the upper surface of the substrate. In addition, since the post having excellent thermal conduction is formed, heat dissipating property may be improved.

In addition, moisture-resistant property and fire-resistant property may be improved by disconnecting the package from the outside.

In addition, the post is formed to protrude to an exterior of the molding part, such that it may serve as the stopper when being connected to the main board.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A semiconductor package comprising:
   a substrate having a first device mounted thereon;
   a first lead frame formed on the substrate;
   a second lead frame formed to be spaced apart from the substrate;
   a post formed on the substrate and formed between the first lead frame and the second lead frame; and
   a molding part formed to surround the substrate and formed to protrude portions of the first and second lead frames,
   wherein the post includes a body part bonded to the substrate and a protruding part protruded to an exterior of the molding part.

2. The semiconductor package of claim 1, wherein the body part has a diameter larger than that of the protruding part.

3. The semiconductor package of claim 1, further comprising a spring formed in the body part.

4. The semiconductor package of claim 3, wherein a top surface portion of the spring and a bottom surface portion of the protruding part are formed to be in contact with each other.

5. The semiconductor package of claim 3, wherein the protruding part protrudes to an exterior of the body part by elastic force.

6. The semiconductor package of claim 3, wherein the protruding part is inserted into the body part by external pressure.

7. The semiconductor package of claim 1, further comprising a main board penetrating through the first and second lead frames and formed to be spaced apart from an upper portion of the molding part.

8. The semiconductor package of claim 7, wherein a bottom surface portion of the main board and a top surface portion of the protruding part are formed to be in contact with each other.

9. The semiconductor package of claim 1, further comprising a second device mounted on the second lead frame.

10. The semiconductor package of claim 6, further comprising a wire electrically connecting at least two of the substrate, the first device, the second device, the first lead frame, and the second lead frame to each other.

11. A method of manufacturing a semiconductor package, the method comprising:
    preparing a substrate on which a first lead frame, a second lead frame, and a first device are mounted;
    forming a post on the substrate and between the first lead frame and the second lead frame;
    forming a molding part to surround the substrate and protrude portions of the first and second lead frames; and
    bending the first and second lead frames by performing a trimming process and a forming process for the first and second lead frames,
    wherein the post includes a body part bonded to the substrate and a protruding part protruded to an exterior of the molding part.

12. The method of claim 11, further comprising, after the preparing of the substrate, mounting a second device on the second lead frame.

13. The method of claim 12, further comprising, after the mounting of the second device, forming a wire electrically connecting at least two of the substrate, the first and second lead frames, and the first and second devices to each other.

14. The method of claim 11, wherein the body part has a diameter larger than that of the protruding part.

15. The method of claim 11, wherein the body part includes a spring formed therein.

16. The method of claim 15, wherein the protruding part protrudes to an exterior of the body part by elastic force.

17. The method of claim 15, wherein the protruding part is inserted into the body part by external pressure.

18. The method of claim 11, wherein the forming of the molding part includes:
    seating the substrate in a lower mold;

inserting the protruding part into the body part by positioning an upper mold on the lower mold;
injecting a molding material; and
removing the mold.

19. The method of claim 11, further comprising, after the bending of the lead frames, positioning a main board to be electrically connected to the first and second lead frames and to be spaced apart from an upper portion of the molding part.

20. The method of claim 15, wherein a bottom surface portion of the main board and a top surface portion of the protruding part are formed to be in contact with each other.

* * * * *